(12) United States Patent
Walmsley et al.

(10) Patent No.: US 8,049,579 B2
(45) Date of Patent: Nov. 1, 2011

(54) RESONATOR HAVING A STATOR COUPLED TO THREE STATOR VOLTAGES

(75) Inventors: Robert G. Walmsley, Palo Alto, CA (US); Wenhua Zhang, Sunnyvale, CA (US); Lennie K Kiyama, Los Altos, CA (US); Peter Hartwell, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 618 days.

(21) Appl. No.: 12/261,647

(22) Filed: Oct. 30, 2008

(65) Prior Publication Data

US 2010/0109579 A1    May 6, 2010

(51) Int. Cl.
*H03H 9/125* (2006.01)
(52) U.S. Cl. .................................. 333/186; 310/309
(58) Field of Classification Search .............. 333/186, 333/197–200; 310/309; 33/318; 74/5 R, 74/5.4
See application file for complete search history.

(56) References Cited

U.S. PATENT DOCUMENTS

| | | | |
|---|---|---|---|
| 5,448,124 A * | 9/1995 | Higuchi et al. | 310/309 |
| 5,541,465 A * | 7/1996 | Higuchi et al. | 310/309 |
| 5,640,133 A * | 6/1997 | MacDonald et al. | 333/197 |
| 5,719,336 A | 2/1998 | Ando et al. | |
| 5,894,091 A | 4/1999 | Kubota | |
| 5,986,381 A | 11/1999 | Hoen et al. | |
| 6,041,653 A | 3/2000 | Ichikawa et al. | |
| 6,223,598 B1 | 5/2001 | Judy | |
| 6,236,281 B1 * | 5/2001 | Nguyen et al. | 331/154 |
| 6,497,141 B1 | 12/2002 | Turner et al. | |
| 6,591,678 B2 | 7/2003 | Sakai | |
| 6,753,664 B2 | 6/2004 | Neufeld et al. | |
| 6,888,662 B2 | 5/2005 | Abu-Ageel | |
| 6,900,575 B2 | 5/2005 | Olkhovets et al. | |
| 6,930,368 B2 | 8/2005 | Hartwell et al. | |
| 7,119,550 B2 | 10/2006 | Kitano et al. | |
| 7,343,801 B2 | 3/2008 | Kapser et al. | |
| 7,859,365 B2 * | 12/2010 | Ho et al. | 333/186 |
| 2002/0020219 A1 * | 2/2002 | DeRoo et al. | 73/504.12 |
| 2003/0173864 A1 | 9/2003 | Zalalutdinov et al. | |
| 2004/0113516 A1 | 6/2004 | Miller et al. | |
| 2005/0156481 A1 | 7/2005 | Zhou et al. | |
| 2005/0156695 A1 | 7/2005 | Andricacos et al. | |
| 2006/0208608 A1 | 9/2006 | Kim et al. | |
| 2008/0178674 A1 | 7/2008 | Walmsley | |

* cited by examiner

*Primary Examiner* — Barbara Summons

(57) ABSTRACT

A resonator includes a translator, a stator, and a control circuit. The control circuit is configured to provide first and second translator voltages and first through third stator voltages, wherein the translator is configured to move with respect to the stator at a resonant frequency of the resonator in response to the control circuit.

15 Claims, 6 Drawing Sheets

RESONATOR HAVING A STATOR COUPLED TO THREE STATOR VOLTAGES

CROSS-REFERENCES

This application is related to copending and commonly assigned Non-Provisional U.S. patent application Ser. No. 11/668,951, entitled "THREE PHASE CAPACITANCE-BASED SENSING AND ACTUATION," filed by the same inventors to this instant patent application on Jan. 30, 2007, the disclosure of which is hereby incorporated by reference in its entirety.

BACKGROUND

Resonators within microelectromechanical systems (MEMS) have been required for a variety of applications including oscillators, filters, gyroscopes, mass sensors, and many other devices. Generally, resonators have been divided into two categories based on the direction of the motion: vertical resonators and lateral resonators. While lateral resonators are considered superior with respect to amplitude, damping and ease of coupling to other structures, conventional comb-drive lateral-resonators have provided much smaller available force per unit area of the resonator than vertical resonators. Thus, a lateral electrostatic MEMS resonator with an increased resonant amplitude and a stability of the resonant amplitude may be useful in some applications.

BRIEF DESCRIPTION OF DRAWINGS

The embodiments of the invention will be described in detail in the following description with reference to the following figures.

DETAILED DESCRIPTION OF EMBODIMENTS

For simplicity and illustrative purposes, the principles of the embodiments are described by referring mainly to examples thereof. In the following description, numerous specific details are set forth in order to provide a thorough understanding of the embodiments. It will be apparent, however, to one of ordinary skill in the art, that the embodiments may be practiced without limitation to these specific details. In some instances, well known methods and structures have not been described in detail so as not to unnecessarily obscure the embodiments.

According to an embodiment of the invention, a resonator includes a stator and translator elastically suspended within the resonator and connected to two sinusoidal input voltages. The resonator, by properly choosing a ratio of a pitch between a pair of immediately adjacent electrodes of the translator to a pitch between a pair of immediately adjacent electrodes of the stator and a ratio of a pitch between immediately adjacent electrodes of the translator to a gap between the translator and the stator may have a large available force per unit area of the resonator. The resonator may be driven by driving signals with a frequency about or at least substantially equal to a structural resonant frequency of the resonator or, for a parametric resonance, with a frequency approximately twice the structural resonant frequency in order to increase the resonant amplitude. Further, the resonance frequency of the resonator may be tuned by using the drive signals with an approximately or substantially sinusoidal component and a non-zero, time-invariant, direct current (DC) component.

These methods provide for a large actuation force density per unit area of the resonator, stability of the resonant amplitude, tuning of the resonant frequency, as well as the ability to compensate for other fabrication non-idealities. Large and stable resonant amplitudes benefit many resonator applications including MEMS gyroscopes.

Figure 1:
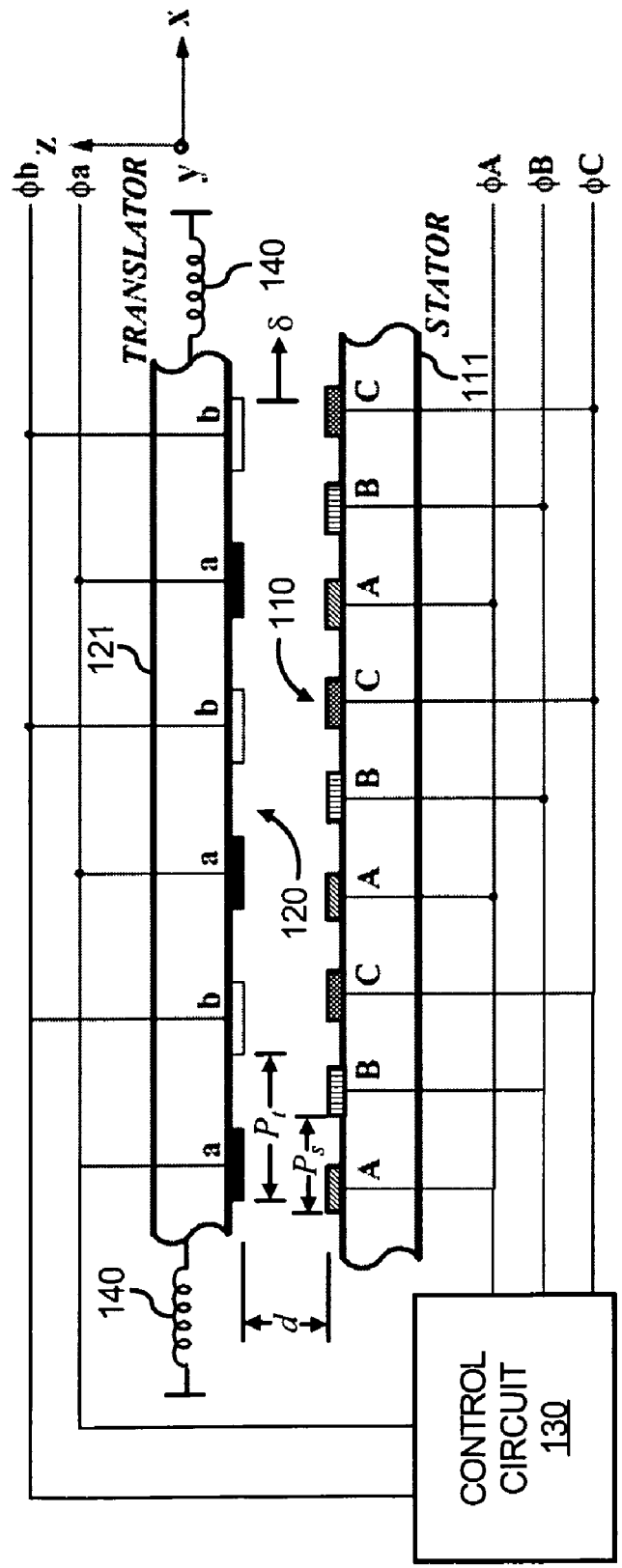
FIG. 1 illustrates a resonator according to an embodiment of the invention, where conductive electrodes designated a, b, A, B and C are elongate normal to the view shown.

FIG. 1 illustrates a resonator 100 that provides an available force per unit area of the resonator 100 that is much closer to that achieved by vertical resonators, according to an embodiment of the invention. The resonator 100 includes a stator 110, a translator 120, and a control circuit 130. It should be understood that the system 100 may include additional components and that some of the components described herein may be removed and/or modified without departing from a scope of the system 100.

The resonator 100 may be any reasonably suitable resonator that includes a translator and a stator, which resonates in response to drive signals. For instance, the resonator 100 may be a planar dipolar electrostatic (DPE) resonator.

The stator 110 includes a structure 111 fixedly positioned within the resonator 100 and a first set of electrodes, A, commonly connected to receive a first stator voltage/signal φA, a second set of electrodes, B, commonly connected to receive a second stator voltage/signal φB, and a third set of electrodes, C, commonly connected to receive a third stator voltage/signal φC. The translator 120 includes a structure 121 connected to a suspension structure 140 and is movable within the resonator 100 through the suspension structure 140. The translator 120 further includes a first set of electrodes, a, commonly connected to receive a first stator voltage/signal φa and a second set of electrodes, b, commonly connected to receive a second stator voltage/signal φb. The first through third sets of electrodes A-C of the stator 110 and the first and second set of electrodes a-b of the translator 120 each includes an electrode that is elongated in the y-coordinate direction. The suspension structure 140 may resist an out-of-plane force (for instance, a force along the z-coordinate direction) while allowing lateral, in-plane motion (for instance, a movement along the x-coordinate direction). The suspension structure 140 may be any reasonably suitable suspension structure for elastically suspending the translator 120 within the resonator 100 such as a spring, other elastic material, etc.

As to specific dimensions of the stator 110 and the translator 120, a ratio, R, of the translator pitch Pt to the stator pitch Ps may be about or at least substantially equal to 1.5 or equivalently, R=Pt/Ps=1.5, where a pitch is a distance between same points on two adjacent electrodes of either the stator 110 or the translator 120. As a result of the required translator-to-stator pitch ratio, R=1.5, repetitive electrode groups are formed with 2 electrodes per group on the translator 120 designated a and b, and 3 electrodes per group on the stator 110 designated A, B, and C. These electrode groups are repeated or elongated as required to fill available space on the resonator. Generally, the number of groups on the stator 110 is greater than the number of groups on the translator 120 in order to allow for the maximum displacement of the resonator without a change in overlap. The repetition or group length, L, of the electrode array is equal to 2 times the translator pitch (L=2×Pt) or equivalently, 3 times the stator pitch (L=3×Ps). In order for the resonator 100 to resonate, the pitches of the stator 110 and the translator 120 may be chosen such that the periodicity of a force exerted on the translator 120 by the resonator 100 in the x-coordinate direction will provide a requisite resonant amplitude Ar. Typically, the pitches of the stator 110 and the translator 120 are chosen so that Ar is about Pt/2.

As to the relationship of the pitches of the stator 110 and the translator 120 to a gap d between the stator 110 and translator 120, the ratio of the pitch Pt of the translator 120 to the gap d may be selected to approximately or at least substantially equal 1.6 in order to obtain a maximum change in the cross-capacitances per change in position of the translator 120 along the x-coordinate direction (that is, dC/dx). However, it should be understood that other values may be employed for the ratio of the pitch Pt of the translator 120 to the gap d such as any ratio within the range of 1 to 5. By selectively choosing the pitches of the stator 110 and the translator 120 and the gap d between them and providing first through third stator signals φA-φC and first and second translator signals φa-φb of the resonator 100 as described below, a powerful and flexible resonator 100 may be achieved.

The control circuit 130 generates the first through third stator signals φA-φC and first and second translator signals φa-φb. The control circuit 130 may be any reasonably suitable circuit for generating the first through third stator signals φA-φC and first and second translator signals φa-φb. The generated signals may selectively conform to the following equations:

$$\phi A = Vo - Vr \times \cos(\theta c - 2\pi/3), \quad (1)$$

$$\phi B = Vo - Vr \times \cos(\theta c), \quad (2)$$

$$\phi C = Vo - Vr \times \cos(\theta c + 2\pi/3), \quad (3)$$

$$\phi a = Vo + Vr \times f(t), \text{ and} \quad (4)$$

$$\phi b = Vo - Vr \times f(t), \quad (5)$$

where θc is an electrical phase angle ranging between 0 and 2π, Vo is a bias voltage, Vr is a force scaling voltage, and f(t) is a function of time. Vr, and thus signals φA-φC and φa-φb, may be limited by a supply voltage Vs of the resonator 100 according to the following equation:

$$2Vr < Vs. \quad (6)$$

Figure 2:
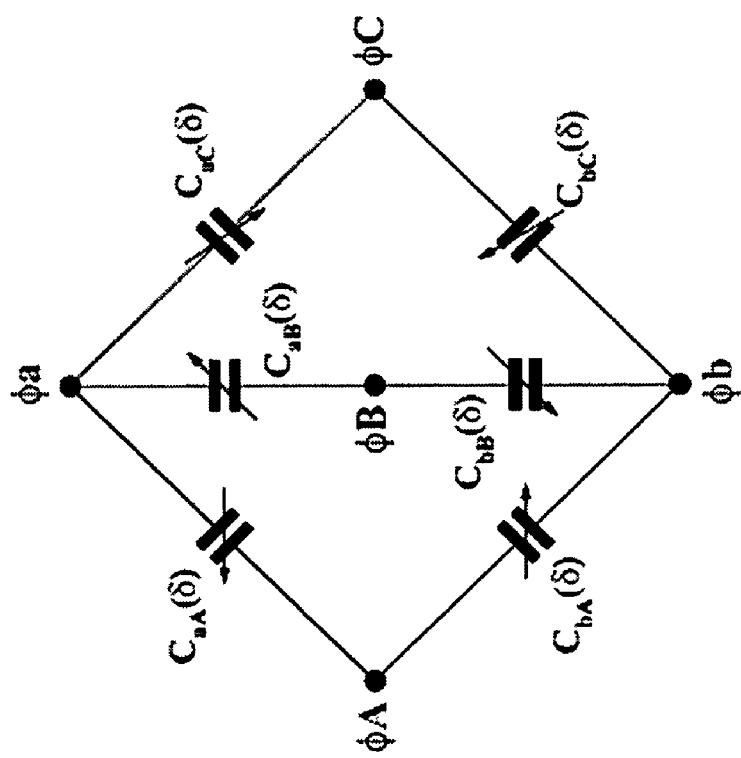
FIG. 2 illustrates a simplified equivalent circuit, which includes only cross-capacitance elements formed by a stator and a translator of the resonator according to an embodiment of the invention.

Turning now to FIG. 2, shown therein is a circuit equivalent to a cross-capacitance circuit formed by the stator 110 and the translator 120 that shows the cross-capacitance components between the stator 110 and the translator 120 as a function of a displacement δ of the translator 120 relative to the stator 110, according to an embodiment of the invention. For the electrode configuration and electrode gap prescribed for the present invention, these cross-capacitances are closely approximated by:

$$CaA(\delta) = CaA(d, \theta p, L) = Cs(d,L) \times \cos(\theta p - 2\pi/3) + Co(d,L), \quad (7)$$

$$CaB(\delta) = CaB(d, \theta p, L) = Cs(d,L) \times \cos(\theta p) + Co(d,L), \quad (8)$$

$$CaC(\delta) = CaC(d, \theta p, L) = Cs(d,L) \times \cos(\theta p + 2\pi/3) + Co(d,L), \quad (9)$$

$$CbA(\delta) = CbA(d, \theta p, L) = Cs(d,L) \times \cos(\theta p + \pi/3) + Co(d,L), \quad (10)$$

$$CbB(\delta) = CbB(d, \theta p, L) = Cs(d,L) \times \cos(\theta p + \pi) + Co(d,L), \text{ and} \quad (11)$$

$$CbC(\delta) = CbC(d, \theta p, L) = Cs(d,L) \times \cos(\theta p + 5\pi/3) + Co(d,L), \quad (12)$$

where Cs(d,L) is the amplitude of the cyclic position-dependent capacitance, Co(d,L) is a position independent capacitance term, and θp is the angular position given by:

$$\theta p = 2\pi \delta / L = \pi \delta / Pt. \quad (13)$$

Although not shown, it is understood that other constant and variable capacitances associated with the stator 110 and the translator 120 including parasitic capacitances may exist that are not taken into account in the schematic of FIG. 2. While the capacitances shown in FIG. 2 vary with the relative position of the stator 110 and the translator 120, it is understood that the parasitic capacitances that are not shown may not experience significant variation or may be constant.

Figure 3:
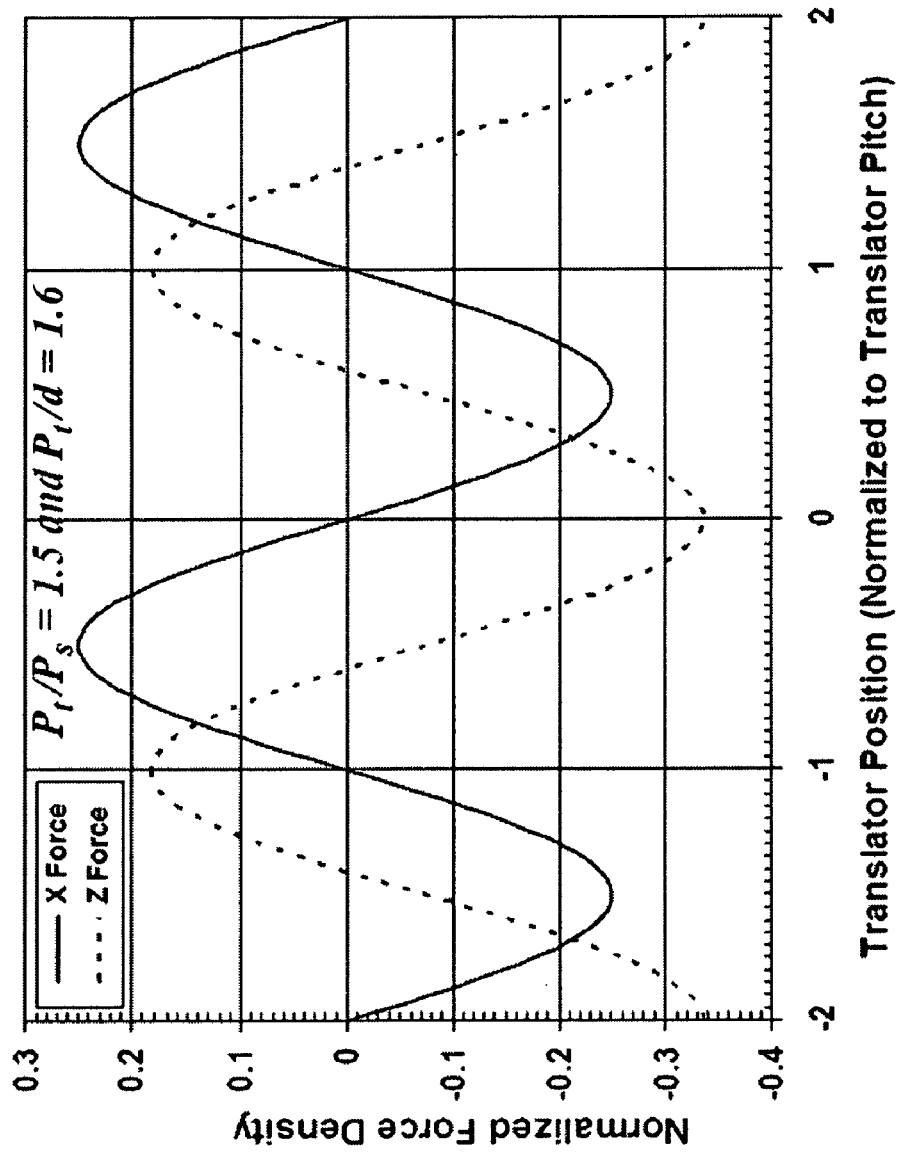
FIG. 3 illustrates a graph showing normalized force densities of translator forces versus a position of the translator according to an embodiment of the invention.

Turning now to FIG. 3, shown therein is a graph showing a normalized force density along the x-coordinate direction of the resonator 100 and a normalized force density along the z-coordinate direction of the resonator 100 versus a position of the translator 120 by assuming the electrical phase angle θc of −π radians, Pt/Ps=1.5, Pt/d=1.6, Vo=0 volts, f(t)=1 and δ=0 as shown in FIG. 1, according to an embodiment of the invention. Force density determined using an analytical electrostatic calculation and checked by Finite Element Analysis, is normalized to that of a parallel-plate capacitors with the same capacitor area as the array overlap area and the same spacing d. The translator position is normalized to the translator pitch Pt as the x-coordinate=δ/Pt. The force density curves shown in FIG. 3 may be shifted left or right by adjusting the electrical phase angle θc, and applying new stator voltages φA-φC according to the equations (1)-(3). When the force density curves are shifted laterally relative to a fixed translator 110 by applying new stator voltages φA-φC, the force density curves are shifted in their entireties without changing shapes. By allowing shifts of the force density curves through application of different stator voltages φA-φC, fabrication misalignments and other fabrication non-idealities may be compensated, and/or optimization of the drive signals φA-φC and φa-φb may be achieved.

The electrostatic x force density shown in FIG. 3 may be approximated by a single component sinusoid which depends on the position angle of the translator, θp, the electrical phase angle, θc, as well as the scaling voltage, Vr, and the voltage modulation function, f(t). The total x force, Fx, experienced by the translator can be expressed as:

$$Fx = -k\delta + f(t) \times Vr^2 \times Ae \times Ke \times \sin(\theta c + \theta p - \pi/2), \quad (14)$$

where k is the suspension spring constant (N/m) of the suspension structure 140, Ae is the electrode array overlap area (m^2), Ke is the voltage-to-force scaling factor (N/[m^2*V^2]), which depends on d and L of the resonator 100. When L=12 microns and d=3.75 microns, Ke~0.08 N/[m^2*V^2]. This is equivalent to approximately 13% of the force density generated by a parallel plate resonator with the same area and gap, an exceptional number compared with more conventional electrostatic comb-finger MEMS resonators.

Figure 4:
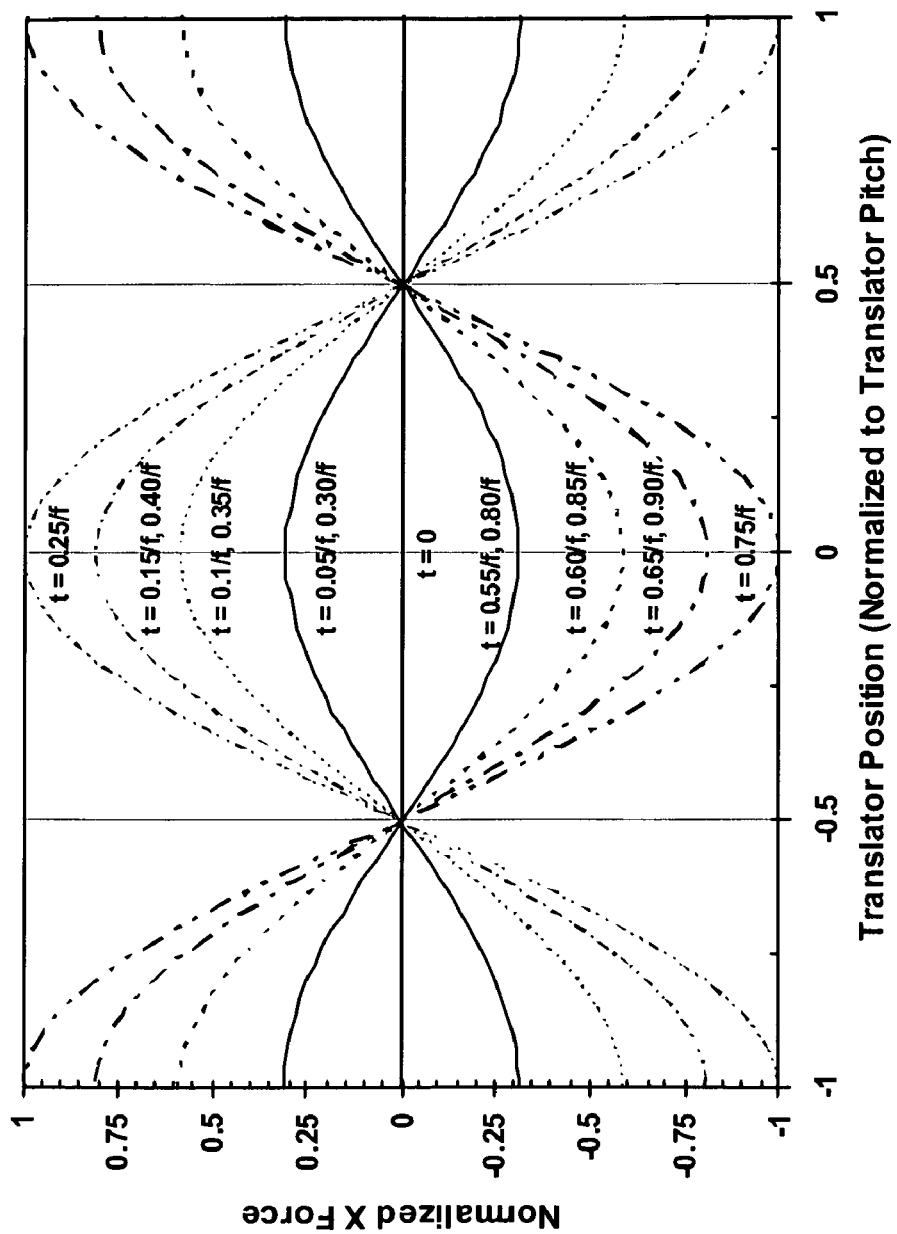
FIG. 4 illustrates a graph showing a harmonic drive of the resonator according to an embodiment of the invention.

Turning now to FIG. 4, shown therein is a graph showing a harmonic drive of the resonator 100, where the drive signal φa of the translator 120 is a periodic signal driven at a frequency at least substantially equal to a structural resonant frequency fr of the resonator 100 and the drive signal φb of the translator 120 is an inverse of the periodic signal, according to an embodiment of the invention. The f(t) of equations 4 and 5 are replaced by a sinusoidal function as:

$$\phi a = Vo + Vr \times \sin(\omega \times t), \text{ and} \quad (15)$$

$$\phi b = Vo - Vr \times \sin(\omega \times t), \quad (16)$$

where ω is the angular frequency satisfying the relationship ω=2π×xf and t is time. Since the driving frequency f of the drive signals φa-φb of the translator 120 is the structural resonant frequency fr of the resonator 100, the driving method for the resonator 100 in FIG. 4 is referred to as harmonic. The graph shows a series of normalized x force curves of the resonator 100 versus the position of the translator 120 at a series of times, t, assuming that the electrical phase angle θc is π radians and the natural resting position of the translator 120 within the resonator 100 absent the drive signals φA-φC and φa-φb is the translator position of 0 (i.e., the resonator position shown in FIG. 1). The electrostatic x force under the conditions appropriate for the harmonic drive is given by:

$$Fxe = Vr^2 \times Ae \times Ke \times \sin(\omega \times t) \times \sin(\theta p + \pi/2). \quad (17)$$

The structural resonant frequency fr of a spring-mass-damper system representative of the resonator 100, where the spring-mass-damper system includes a mass corresponding to a mass of the translator 120 and a spring coupled between the mass and a fixed point and corresponding to the suspension structure 140 is given by the following equation:

$$fr = (1/2\pi) \times \text{a square root of } (k/m), \quad (18)$$

where k is a suspension spring constant of the suspension structure 140 in suspending the translator 120 elastically within the resonator 100 and m is the mass of the translator 120.

As to an amplitude of a resonance of the translator 120, the resonator 100 when driven by the drive signals φa-φb pursuant to the equations (15) and (16) may have a maximum resonator amplitude of approximately ±Pt/2. For instance, as the voltage amplitude Vr is increased, an amplitude of the movement of the translator 120 increases and will eventually saturate at ±Pt/2. Such a saturation of the movement amplitude of the translator 120 provides amplitude stabilization that benefits many resonator applications such as gyroscopes by, for instance, substantially reducing any amplitude sensitivity to variations in drive voltages and resonator Q (the quality factor of a resonator) in the saturated drive region.

Figure 5:
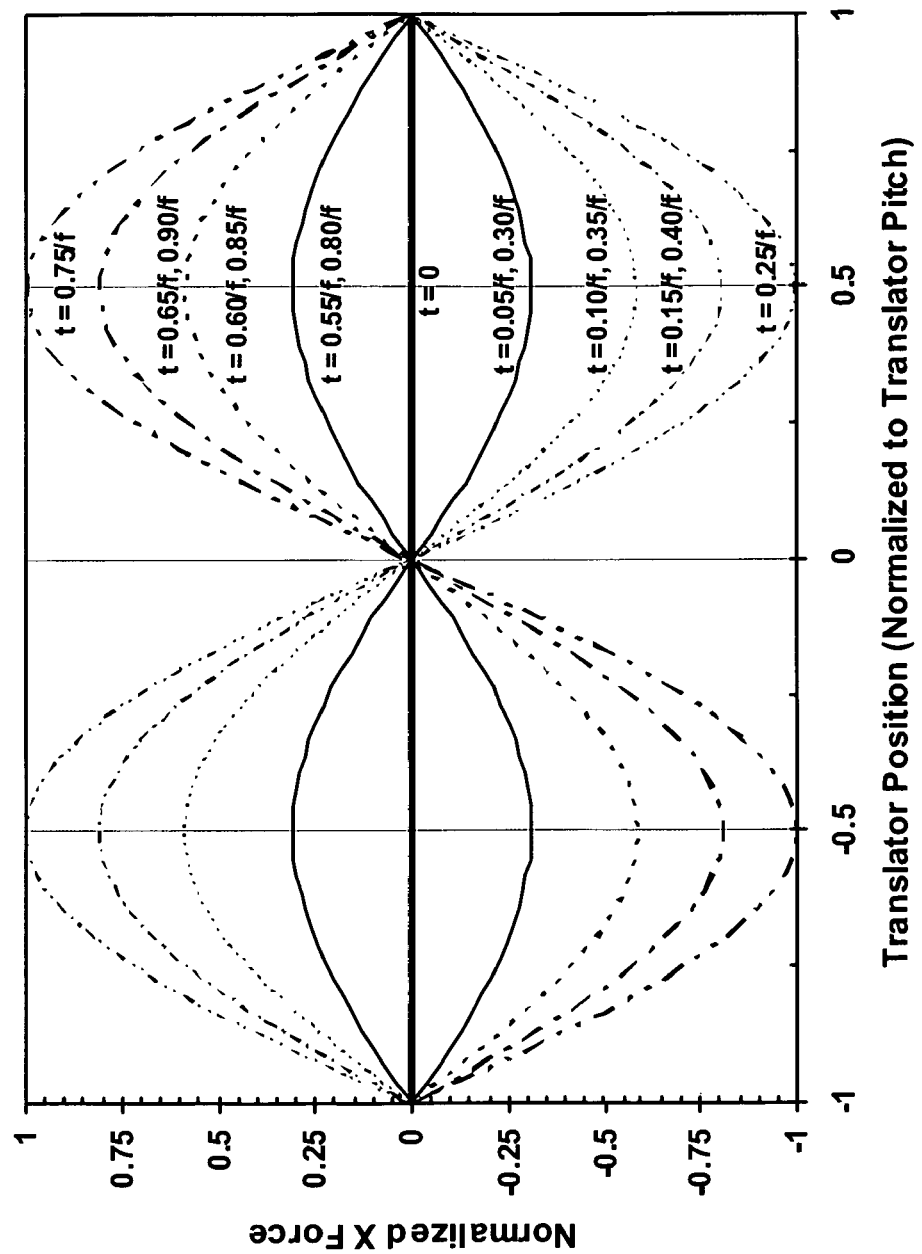
FIG. 5 illustrates a graph showing a parametric drive of the resonator according to an embodiment of the invention.

Now turning to FIG. 5, shown therein is a graph showing a parametric drive of the resonator 100 by utilizing the adjustability of the force-displacement relationship as represented by equation (14). For parametric drive according to an embodiment of the invention, θc is set to −π/2 radians resulting in the electrostatic force relationship:

$$Fxe = Vr^2 \times Ae \times Ke \times \sin(\omega \times t) \times \sin(\theta p - \pi). \quad (19)$$

The graph shows a series of normalized×force curves of the resonator 100 versus the position of the translator 120 at selected times, t, after assuming that the electrical phase angle θc is −π/2 radians and a natural resting position of the translator 120 within the resonator 100 absent the drive signals φA-φC and φa-φb is the translator position of 0. Since the electrical phase angle θc is −π/2, and the 3 stator voltages φA-φC have been adjusted according to equations 1-3, the normalized force along the x-coordinate direction of the resonator 100 has been shifted by 3π/2 radians from that of the graph in FIG. 4, and the driving frequency f of the drive signals φa-φb has increased to approximately or at least substantially equal to two times the structural resonant frequency fr. In this parametric case, a resonance response of the resonator 100 will be at the structural resonant frequency fr. It is interesting to note that the force magnitude at zero position of the translator 120 is not modulated but the slope of the force-displacement curve or equivalently, the electrical spring constant is modulated in time.

By having the resonator 100 driven parametrically as described above, the resonator 100 may obtain larger resonant amplitudes and a greater amplitude stability with the same stator 110 and translator 120 of the resonator 100. Further, the leakage of electrical drive signals into resonator electronics may be reduced. For instance, since the parametric drive frequency is approximately twice the coriolis sensing frequency, direct-coupled electrical interference should be well out-of-band. Since the normalized force along the x-coordinate direction of the resonator 100 is zero at a natural resting position of the translator 120 within the resonator 100 absent the drive signals φA-φC and φa-φb, an additional time-invariant, direct current (DC) bias term may be added to equations (15) and (16) as follows:

$$\phi a = Vo + Vr \sin(\omega_p t) + Vbias, \text{ and} \quad (20)$$

$$\phi b = Vo - Vr \sin(\omega_p t) - Vbias, \quad (21)$$

where $\omega_p$ is the parametric-drive angular frequency and typically equals 2π×fr and Vbias is the additional DC bias voltage, either positive or negative. Adjusting the DC bias voltage Vbias allows tuning of the output resonant frequency of the resonator 100, which is useful, for instance, in a gyroscope design. While an adjustment of the bias voltage Vbias is allowed as described above, a degree of the adjustment may be limited pursuant to the following equation:

$$2 \times (Vr + Vbias) < Vs. \quad (22)$$

For both the harmonic drive method of FIG. 4 and the parametric drive method of FIG. 5, stator drive voltages φA-φC produced in accordance with equations (1)-(3) may be approximated by driving the stator electrodes A-C with a selected one of the following sets of drive voltages φA-φC: (+Vr, −Vr, −Vr), (−Vr, +Vr, −Vr), (−Vr, −Vr, +Vr), (+Vr, +Vr, −Vr), (+Vr, −Vr, +Vr), and (−Vr, +Vr, +Vr). The first through third voltages in the selected set correspond to the first through third stator drive voltages φA-φC, where different ones of the six sets may be selected for different times and at different situations to produce the best electrical force alignment. When one of the six sets of drive voltages φA-φC is selected as the drive voltages φA-φC, if an assumption is made that the stator-to-translator fabrication misalignment is less than ±Pt, where such accuracy may be easily achieved, the maximum electrical force phase misalignment due to fabrication non-idealities will be less than ±π/12 radians, or equivalently, ±Pt/6. The small forcing asymmetry may be acceptable in many applications and the worst-case decreased peak force is largely compensated for by using a full available voltage difference.

As previously mentioned, any fabrication process will result in an initial translator-to-stator misalignment relative to the designed alignment as exemplified in FIG. 1. The structure and methods of the present invention allow the re-alignment of the electrostatic force relationship between stator and translator to be accomplished by electrical adjustments without altering the functional form of that relationship. For example, an initial self-calibrating process would apply the forcing voltages φa-φb as shown in equations 15 and 16 with the frequency f set to the structural resonant frequency, fr, of the resonator. By adjusting θc and applying voltages φA-φC according to equations 1-3, the two values of θc, which minimize resonant amplitude, may be determined. For parametric drive, one of these two θc's would be used to fix voltages, φA-φC, according to equations 1-3 effectively aligning the translator and stator into optimal force alignment for this excitation mode. For harmonic drive, π/2 would be added to or subtracted from either of the determined θc's to determine the two optimal harmonic θc angles [±2nπ to move θc into 0-2π range]. The voltages, φA-φC, would then be adjusted and fixed according to equations 1-3 providing optimal force alignment of translator-to-stator for the harmonic excitation mode. In both excitation cases, the difference between the two aligned θc angles corresponds to a π radian phase shift between driving voltages φa-φb and the force applied to the translator. For a resonator, this inversion would generally not be important, however, if this phase relationship was important, the specific θc required for the application would be selected.

Figure 6:
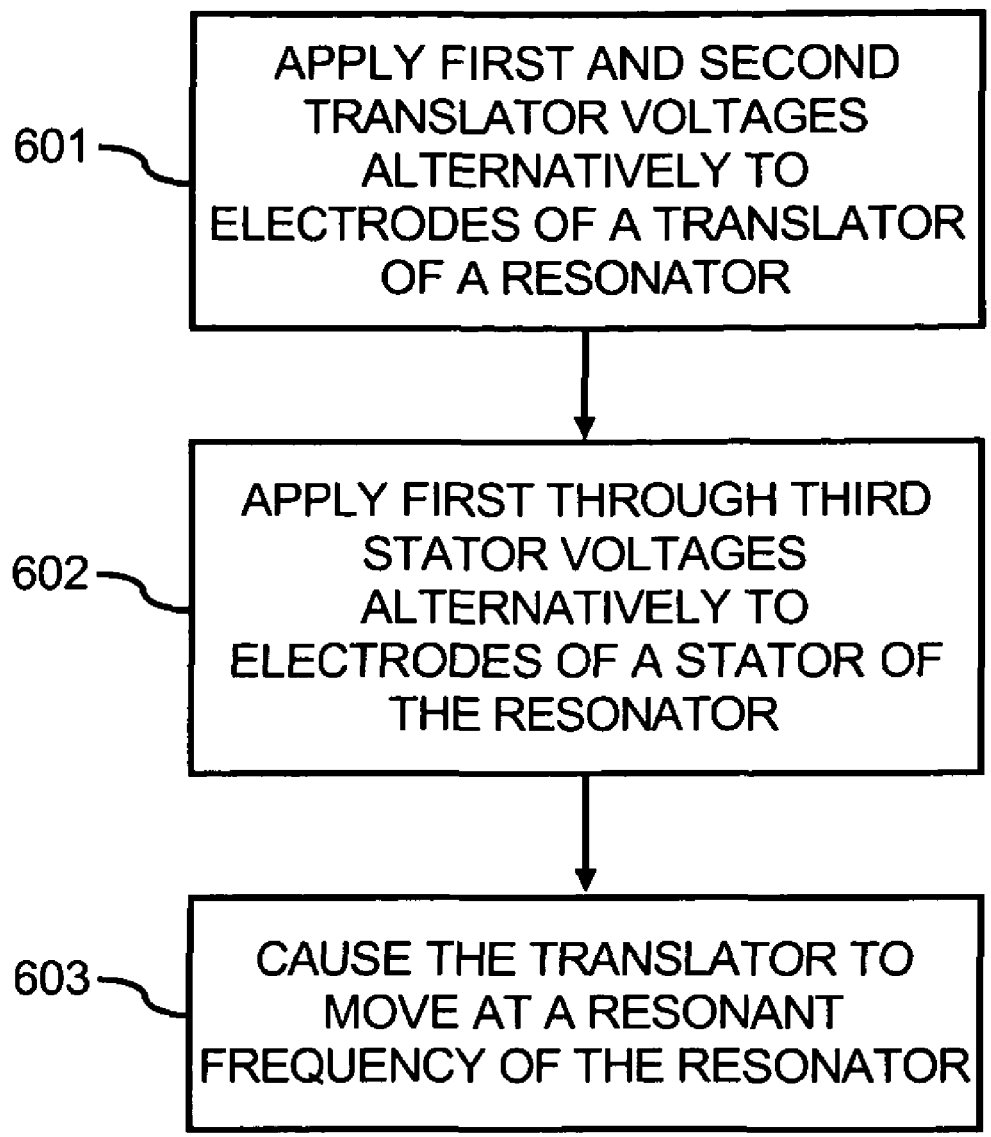
FIG. 6 illustrates a method for providing drive voltages to the stator and the translator of the resonator and causing the stator to move at a resonant frequency according to an embodiment of the invention.

Turning now to FIG. 6, shown therein is a method 600 for providing drive voltages to the stator 110 and the translator 120 of the resonator 100 and causing the resonator 100 to move at a resonant frequency, according to an embodiment of the invention. It should be apparent to those of ordinary skill in the art that other steps may be added or existing steps may be removed, modified or rearranged without departing from a scope of the method 600.

At step 601, the first and second translator voltages φa-φb are applied to the translator 120 of the resonator 100, where the translator 120 includes a plurality of electrodes a-b and the first and second translator voltages φa-φb are alternatively applied to the electrodes a-b of the translator 120.

At step 602, the first through third stator voltages φA-φC are applied to the stator 120 of the resonator 100, where the stator 110 includes a plurality of electrodes A-C and the first through third stator voltages φA-φC are alternatively applied to the electrodes A-C of the stator 110.

At step 603, the translator 120 is caused to move at a resonant frequency of the resonator 100.

The above-described operations of providing drive voltages to the stator 110 and the translator 120 of the resonator 100 and causing the translator 120 to resonate in reference to exemplary features and embodiments of FIGS. 1-6 may be contained as a computer program product embodied on one or more tangible computer readable storage mediums. The computer program product may exist in a variety of forms both active and inactive. For instance, the computer program product may exist as software program(s) having program instructions in source code, object code, executable code or other formats whether compressed or uncompressed. Exemplary tangible computer readable storage mediums include conventional computer system RAM, ROM, EPROM, EEPROM, and magnetic or optical disks or tapes.

While exemplary features and embodiments of FIGS. 1-6 have been explained within the context of each feature and embodiment, any one or all of the exemplary features and embodiments of the invention may be applied and is incorporated in any and all of the embodiments of the invention unless clearly contradictory.

While the embodiments have been described with reference to examples, those skilled in the art will be able to make various modifications to the described embodiments without departing from the scope of the claimed embodiments.

What is claimed is:

1. A resonator comprising:
    a translator including a first set of translator electrodes commonly connected to a first translator voltage and a second set of translator electrodes commonly connected to a second translator voltage, wherein the first set of translator electrodes are arranged on the translator alternatively with the second set of translator electrodes;
    a stator including a first set of stator electrodes commonly connected to a first stator voltage, a second set of stator electrodes commonly connected to a second stator voltage, and a third set of stator electrodes commonly connected to a third stator voltage, wherein the first set of stator electrodes are arranged on the stator alternatively with the second and third sets of stator electrodes; and
    a control circuit configured to provide the first and second translator voltages and first through third stator voltages, wherein the translator is configured to move with respect to the stator at a resonant frequency of the resonator in response to the control circuit.

2. The resonator of claim 1, wherein a ratio of a pitch between a pair of immediately adjacent electrodes of the translator to a pitch between a pair of immediately adjacent electrodes of the stator is at least substantially equal to 1.5.

3. The resonator of claim 1, wherein the ratio of a pitch between immediately adjacent electrodes of the translator to a gap between the translator and the stator is at least substantially equal to 1.6.

4. The resonator of claim 1, wherein the first translator voltage is a periodic signal having a frequency at least substantially equal to a structural resonant frequency of the resonator, and the second translator voltage is an inverse of the periodic signal.

5. The resonator of claim 1, wherein each of the first and second translator voltages are periodic signals in time having a frequency approximately two times a structural resonant frequency of the resonator for the movement of the translator with respect to the stator.

6. The resonator of claim 1, wherein the first and second translator voltages each include a periodic component in time and a non-zero, time-invariant component forming a bias voltage, and the bias voltage is useable for tuning the resonator.

7. The resonator of claim 1, wherein a set of the first through third stator voltages is a selected one of (+Vr, −Vr, −Vr), (−Vr, +Vr, −Vr), (−Vr, −Vr, +Vr) (+Vr, +Vr, −Vr), (+Vr, −Vr, +Vr), and (−Vr, +Vr, +Vr), where the first through third voltages in order in the selected set correspond to the first through third stator voltages, respectively.

8. The resonator of claim 1, further comprising a suspension structure to elastically suspend the translator within the resonator.

9. A method comprising:
    providing first and second translator voltages to a translator of a resonator, wherein the translator includes a first set of translator electrodes commonly connected to the first translator voltage and a second set of translator electrodes commonly connected to the second translator voltage, wherein the first set of translator electrodes are arranged on the translator alternatively with the second set of translator electrodes;
    providing first through third stator voltages to a stator of the resonator, wherein the stator includes a first set of stator electrodes commonly connected to the first stator voltage, a second set of stator electrodes commonly connected to the second stator voltage, and a third set of stator electrodes commonly connected to the third stator voltage, wherein the first set of stator electrodes are arranged on the stator alternatively with the second and third sets of stator electrodes; and
    causing the stator to move at a resonant frequency of the resonator.

10. The method of claim 9, wherein each of the first and second translator voltages are periodic signals having a frequency approximately two times a structural resonant frequency of the resonator for the movement of the translator with respect to the stator.

11. The method of claim 9, wherein the first translator voltage is a periodic signal having a frequency at least substantially equal to a structural resonant frequency of the resonator, and the second translator voltage is an inverse of the periodic signal.

12. The method of claim 9, wherein a set of the first through third stator voltages is a selected one of (+Vr, −Vr, −Vr), (−Vr, +Vr, −Vr), (−Vr, −Vr, +Vr), (+Vr, +Vr, −Vr), (+Vr, −Vr, +Vr), and (−Vr, +Vr, +Vr), where the first through third voltages in order in the selected set correspond to the first through third stator voltages, respectively.

13. A computer program product embodied on one or more computer readable storage mediums, the computer program product comprising instructions for:

providing first and second translator voltages to a translator of a resonator, wherein the translator includes a first set of translator electrodes commonly connected to the first translator voltage and a second set of translator electrodes commonly connected to the second translator voltage, wherein the first set of translator electrodes are arranged on the translator alternatively with the second set of translator electrodes;

providing first through third stator voltages to a stator of the resonator, wherein the stator includes a first set of stator electrodes commonly connected to the first stator voltage, a second set of stator electrodes commonly connected to the second stator voltage, and a third set of stator electrodes commonly connected to the third stator voltage, wherein the first set of stator electrodes are arranged on the stator alternatively with the second and third sets of stator electrodes; and causing the stator to move at a resonant frequency of the resonator.

14. The computer program product of claim 13, wherein each of the first and second translator voltages are periodic signals having a frequency approximately two times a structural resonant frequency of the resonator for the movement of the translator with respect to the stator.

15. The computer program product of claim 13, wherein the first translator voltage is a periodic signal having a frequency at least substantially equal to a structural resonant frequency of the resonator, and the second translator voltage is an inverse of the periodic signal.

* * * * *

UNITED STATES PATENT AND TRADEMARK OFFICE
CERTIFICATE OF CORRECTION

PATENT NO.        : 8,049,579 B2
APPLICATION NO.   : 12/261647
DATED             : November 1, 2011
INVENTOR(S)       : Robert G. Walmsley et al.

It is certified that error appears in the above-identified patent and that said Letters Patent is hereby corrected as shown below:

In column 8, line 41, in Claim 7, delete "(-Vr, -Vr, +Vr)" and insert -- (-Vr, -Vr, +Vr), --, therefor.

In column 8, line 66, in Claim 9, delete "stator" and insert -- translator --, therefor.

In column 10, line 13, in Claim 13, delete "stator" and insert -- translator --, therefor.

Signed and Sealed this
Fourteenth Day of August, 2012

David J. Kappos
*Director of the United States Patent and Trademark Office*